United States Patent [19]
Fujisaki

[11] 4,218,665
[45] Aug. 19, 1980

[54] BAND-PASS FILTER

[75] Inventor: Hisashi Fujisaki, Tokyo, Japan

[73] Assignee: Nippon Electric Company, Ltd., Tokyo, Japan

[21] Appl. No.: 887,909

[22] Filed: Mar. 17, 1978

[30] Foreign Application Priority Data

Mar. 18, 1977 [JP] Japan .................................. 52-30629

[51] Int. Cl.² .......................... H03H 7/10; H03H 7/30; H03K 5/153; H03K 5/159
[52] U.S. Cl. .............................. 333/165; 307/221 D; 333/172; 333/173; 333/174
[58] Field of Search ............... 333/165, 166, 172, 173, 333/174; 357/24; 307/221 R, 221 C, 221 D; 328/67, 66, 167; 364/824, 825, 862

[56] References Cited

U.S. PATENT DOCUMENTS

| | | | |
|---|---|---|---|
| 2,752,491 | 6/1956 | Ringoen | 333/173 X |
| 3,526,858 | 9/1970 | Heinlein et al. | 333/173 |
| 3,531,741 | 9/1970 | Langer | 333/173 |
| 3,603,898 | 9/1971 | Dawson et al. | 333/173 |
| 3,783,413 | 1/1974 | Froment et al. | 332/23 |

OTHER PUBLICATIONS

Harden–"Digital Filters With IC's Boost Q Without Inductors" in Electronics, Jul. 24, 1967; pp. 91–100.
Franks et al.–"An Alternative Approach to the Realization of Network Functions; The N-Path Filter" in the Bell System Technical Journal; 9/1960; pp. 1321–1350.

Primary Examiner—Marvin L. Nussbaum
Attorney, Agent, or Firm—Sughrue, Rothwell, Mion, Zinn and Macpeak

[57] ABSTRACT

A bandpass filter is disclosed which includes a low-pass filter and an analog delay circuit in which the delay time is set by a clock signal. The analog delay circuit samples the voltage of the low-pass filter capacitor and delays the sampled voltage according to the clock signal. The output of the analog delay circuit is then used to equalize within a certain period of time the voltage of the low-pass filter capacitor. The analog delay circuit may consist of an integrated circuit BBD (Bucket Brigade Device) or CCD (Charge Coupled Device).

3 Claims, 7 Drawing Figures

BAND-PASS FILTER

BACKGROUND OF THE INVENTION

This invention relates to band-pass filters and more particularly to band-pass filters using an analog delay circuit in which the delay time is set by a clock signal.

Among conventional band-pass filters is the N-path filter whose center frequency can be set in accordance with a clock frequency. An N-path filter consists of a resistor and N capacitors, each of which, when connected to the resistor through a switch opened and closed by a clock, constitutes in combination with the resistor a lowpass filter or, when separated therefrom, acts as an analog voltage memory. Sequential scanning of these N capacitors arranged in parallel effectively results in memorization of a period of the input waveform at N points. Therefore, in order to reduce distortion due to the scanning or sampling, the number of samples taken in a period, i.e., N, should be increased but this requires a corresponding increase in number of components of the circuit. For details of such N-path filters, reference is made to the following literature:

1. Franks et al., "An Alternative Approach to the Realization of Network Transfer Functions: The N-Path Filter", *The Bell System Technical Journal*, September 1960, pp. 1,321 thru 1,350;
2. Harden, "Digital Filters with IC's Boost Q without Inductors", *Electronics*, July 24, 1967, pp. 91 thru 100; and
3. U.S. Pat. No. 3,783,413 issued on Jan. 1, 1974.

SUMMARY OF THE INVENTION

An object of the present invention is to provide a novel band-pass filter free of the above-stated disadvantage.

In accordance with the present invention, a band-pass filter comprises a lowpass filter consisting of a resistor and a capacitor, a clock signal generator for generating a clock signal, an analog signal delay circuit connected to the lowpass filter for sampling the voltage of the capacitor and delaying the sampled voltage according to the clock signal, and means actuated in synchronism with the clock signal for equalizing within a certain period of time the voltage of the capacitor to the output voltage of the analog signal delay circuit.

The distinct feature of the present invention thus consists in the separation of the two functions of the capacitors in an N-path filter, i.e., the function of a lowpass filter and that as an analog voltage memory, and the consequent composition of a band-pass filter out of two different circuits each having a single function, one being that of a lowpass filter and the other that of an analog memory (namely an analog signal delay circuit). Particularly, it is possible to readily increase N, the number of samples taken in a period, by using an integrated circuit of charge transfer elements such as a bucket brigade device (BBD) or a charge coupled device (CCD), so that distortion due to sampling can be reduced without increasing the number of components of the circuit.

BRIEF DESCRIPTION OF THE DRAWINGS

The present invention will now be described in detail with reference to the accompanying drawings, in which.

DESCRIPTION OF THE PREFERRED EMBODIMENTS

Figure 1:
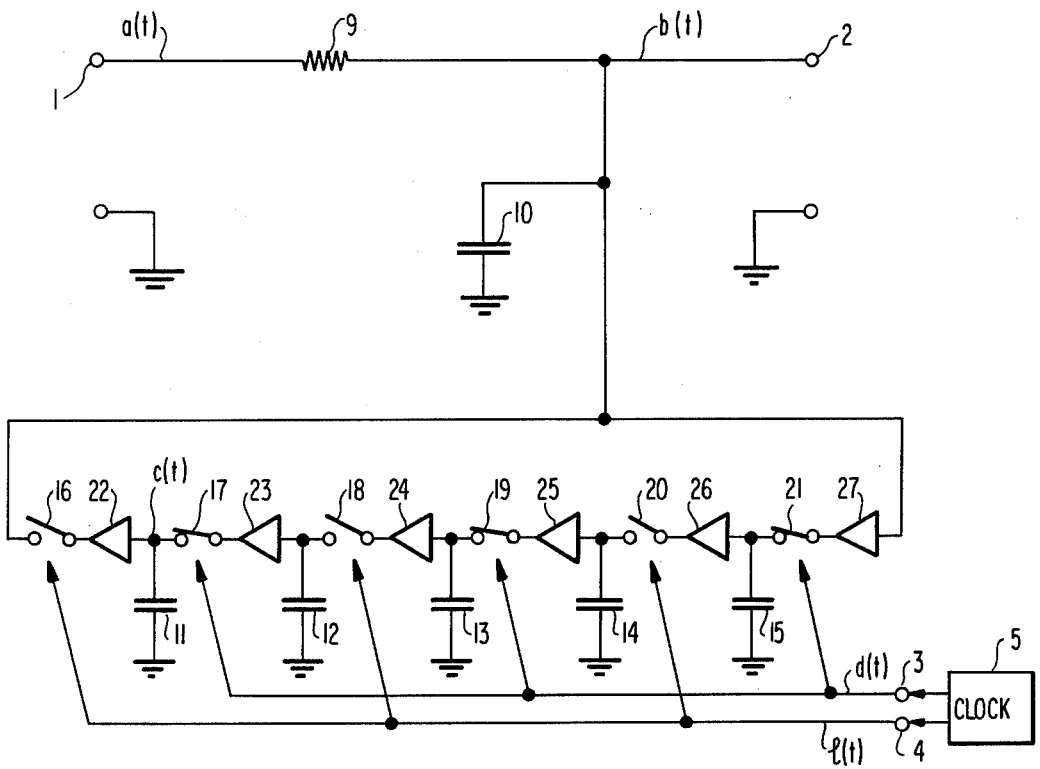
FIG. 1 illustrates a first embodiment according to the present invention.

In FIG. 1, reference number 1 designates an input terminal; 2, an output terminal; 3 and 4, clock signal input terminals; and 5, a clock signal generator (for example, a conventional oscillator). A lowpass filter is composed of a resistor 9 and a capacitor 10. A circulating analog signal delay circuit consists of buffer amplifiers 22-27 whose voltage amplification gains are unity, capacitors 11-15, and switches 16-21. The switches 16, 18 and 20 are actuated by a clock signal e(t) while the switches 17, 19 and 21 are actuated by a negative-phase clock signal d(t).

In FIGS. 2(a) to 2(e), which show time charts of the waveforms in various points of FIG. 1, the reference characters a(t) thru e(t) correspond to those in FIG. 1. The operation of the embodiment of FIG. 1 will be described below with reference to FIGS. 2(a) to 2(e).

At the time $t=1$, the switch 16 is turned off and, since there is a difference than between the voltage b(1) of the capacitor 10, and the voltage a(1) of the input signal, the voltage of the capacitor 10 is discharged to approach that of the input signal. The voltage of the capacitor 10 immediately before the time $t=2$ when the switch 16 is turned on is stored in the capacitor 15 through the buffer amplifier 27 (a voltage follower circuit, for example) and the switch 21. Between the time $t=2$ when the switch 16 is turned on and the time $t=3$ when it is turned off, the voltage of the capacitor 10 equalizes to that of the capacitor 11 and, between the time $t=3$ and the time $t=4$, is charged through the resistor 9 to approach that of the input signal. Meanwhile, between the time $t=2$ when the switch 20 is also turned on and the time $t=3$ when it is turned off, the voltage of the capacitor 14 equalizes to that of the capacitor 15. Between the time $t=3$ when the switch 19 is turned on and the time $t=4$ when it is turned off, the voltage of the capacitor 13 equalizes to that of the capacitor 14. Thus, the voltage b(2) of the capacitor 10 sampled at the time $t=2$ is stored in the capacitor 14 by the time $t=3$ and the capacitor 13 by the time $t=4$. Similarly, it is stored in the capacitor 12 by the time $t=5$ and in the capacitor 11 by the time $t=6$. Between the time $t=6$ when the switch 16 is turned on and the time $t=7$ when it is turned off, the voltage of the capacitor 10 again equalizes to the voltage b(2) at the time $t=2$. As illustrated in FIG. 2, if the input signal voltage from the time $t=1$ until the time $t=2$ is equal to that from the time $t=7$ until the time $t=8$, the voltage of the capacitor 10 further approaches the input signal voltage through the resistor 9. Thus, if a length of time corresponding to an integral multiple of the period of the input signal is equal to the time during which the signal completes a cycle of the analog signal delay circuit, the voltage of the capacitor 10 changes in the same direction in accordance with the input signal through the resistor 9 every time the signal completes a cycle of the analog signal delay circuit and, after the lapse of an adequate length of time, equalizes to that of the input signal. If the length of time corresponding to an integral multiple of the period of the input signal is not equal to the time during which the signal completes a cycle of the analog signal delay circuit, the change to which the voltage of the capacitor 10 is subjected by the input signal through the resistor 9 every time the signal completes a cycle of the analog signal delay circuit is not always in the same direction. Accordingly, the amplitude b(t) at the terminal 2 then is obviously smaller than the amplitude a(t) of the input signal. In other words, this circuit can serve as a band-pass filter if its terminals 1 and 2 are used as input and output terminals, respectively. Alternatively, the terminal of any one of the capacitors 11–15 can as well be used as the output terminal.

Figure 3:
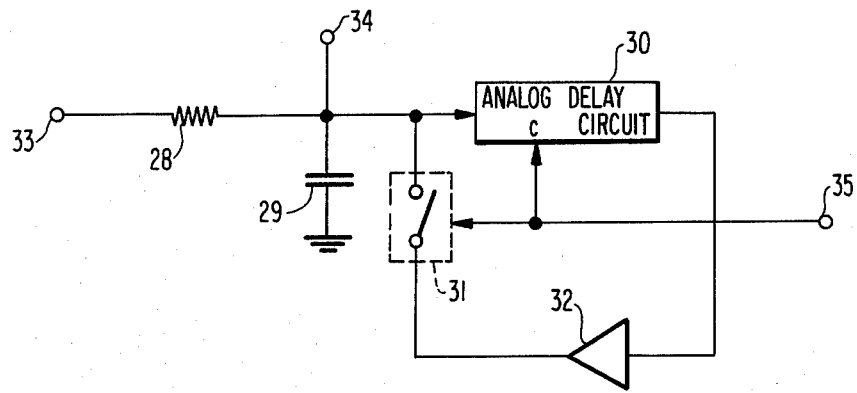
FIG. 3 represents a second embodiment according to the present invention.
Figure 2A:
FIGS. 2(a) to 2(e) show time charts of the waveforms in various points of the circuit of FIG. 1.
Figure 2B:
Figure 2C:
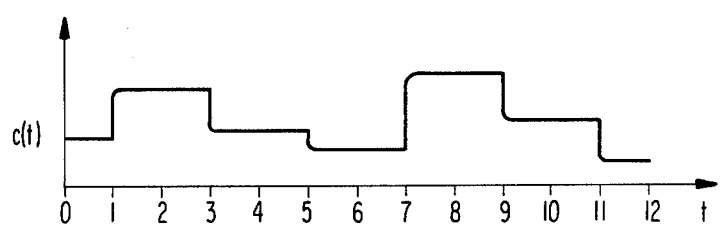
Figure 2D:
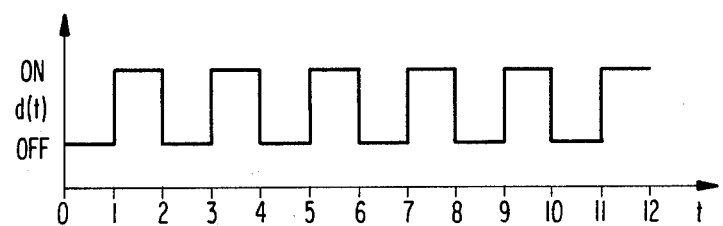
Figure 2E:
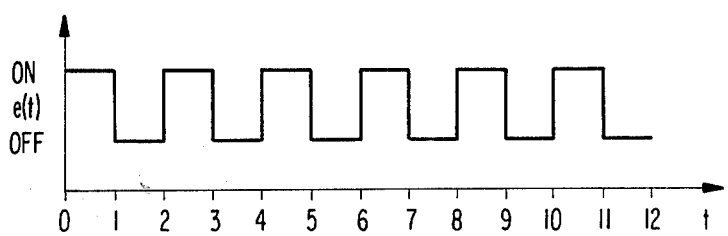

FIG. 3 shows another band-pass filter of the present invention. Reference numeral 28 designates a resistor; 29, a capacitor; 30, an analog signal delay circuit (consisting of an analog shift register BBD or CCD, or an analog memory circulatingly advancing the address by means of a ring counter) for shifting a signal by a clock signal; 31, a switch actuated by the clock signal; 32, an amplifier for compensating for the signal attenuation due to the analog signal delay circuit 30; 33, an input terminal; 34, an output terminal; and 35, a clock input terminal. A low-pass filter comprises the resistor 28 and the capacitor 29. The operation of the band-pass filter is similar to that of the band-pass filter shown in FIG. 1. The center frequency $f_o$ and the bandwidth Q of the band-pass filter shown in FIG. 3 are given in the following equations:

$$f_o = 1/N\delta,$$

and $$Q = \pi CR/T,$$

for A=1 and CR>>T, where N represents the number of stages of the delay circuit 30; $\delta$, the delay time per stage of the delay circuit 30; R, the resistance of the resistor 28; C, the capacitance of the capacitor 29; T, the turn-off time of the switch 31; and, A, the total gain of the delay circuit 30 and the amplifier 32.

As hitherto stated, this invention provides a compact band-pass filter less susceptible to distortion, whose center frequency and bandwidth can readily set.

What is claimed is:

1. A band-pass filter having input and output terminals and a common terminal comprising:
    a lowpass filter consisting of a resistor connected between said input and output terminals and a capacitor connected between said output terminal and said common terminal;
    a clock signal generator for generating a clock signal;
    an analog signal delay circuit responsive to said clock signal generator and connected to said output terminal for sampling the voltage of said capacitor and delaying the sampled voltage according to said clock signal; and
    means connected between the output of said analog signal delay circuit and said output terminal and actuated in synchronism with said clock signal for approximately equalizing the voltage of said capacitor to the output voltage of said analog signal delay circuit.

2. A band-pass filter as claimed in claim 1, wherein said analog signal delay circuit consists of a BBD (Bucket Brigade Device).

3. A band-pass filter as claimed in claim 1, wherein said analog signal delay circuit consists of a CCD (Charge Coupled Device).

* * * * *